United States Patent
Lee et al.

(10) Patent No.: US 11,133,060 B2
(45) Date of Patent: Sep. 28, 2021

(54) DATA STORAGE DEVICE AND OPERATING METHOD THEREOF

(71) Applicant: SK hynix Inc., Gyeonggi-do (KR)

(72) Inventors: Joo Young Lee, Seoul (KR); Hoe Seung Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 51 days.

(21) Appl. No.: 16/523,301

(22) Filed: Jul. 26, 2019

(65) Prior Publication Data
US 2020/0097408 A1  Mar. 26, 2020

(30) Foreign Application Priority Data
Sep. 21, 2018 (KR) .................. 10-2018-0113943

(51) Int. Cl.
*G11C 11/56* (2006.01)
*G11C 11/4093* (2006.01)
*G11C 7/10* (2006.01)

(52) U.S. Cl.
CPC ........ *G11C 11/5628* (2013.01); *G11C 7/1039* (2013.01); *G11C 11/4093* (2013.01); *G11C 2207/2245* (2013.01); *G11C 2211/5648* (2013.01)

(58) Field of Classification Search
None
See application file for complete search history.

(56) References Cited

U.S. PATENT DOCUMENTS

| | | | | |
|---|---|---|---|---|
| 2006/0126390 A1* | 6/2006 | Gorobets | ............ | G11C 11/5628 365/185.22 |
| 2006/0233022 A1* | 10/2006 | Li | ............ | G11C 7/22 365/185.12 |
| 2007/0109854 A1* | 5/2007 | Shibata | ............ | G11C 16/3427 365/185.08 |
| 2008/0065812 A1* | 3/2008 | Li | ............ | G11C 11/5621 711/103 |
| 2008/0192539 A1* | 8/2008 | Choi | ............ | G11C 11/5628 365/185.03 |

(Continued)

FOREIGN PATENT DOCUMENTS

| KR | 1020140142759 | 12/2014 |
|---|---|---|
| KR | 1020170110408 | 10/2017 |

*Primary Examiner* — Nathan Sadler
(74) *Attorney, Agent, or Firm* — IP & T Group LLP

(57) ABSTRACT

A data storage device includes a memory cell array comprising a plurality of pages each including K memory cells of which each stores N bits therein, where N and K are positive numbers greater than or equal to 2, wherein each of the pages stores one page data constituted by N subpage data each having K bits; a cache buffer receiving and caching N subpage data of first page data from a controller; and a page buffer sequentially buffering the respective cached N subpage data of the first page data and store the respective buffered N subpage data of the first page data in the memory cell array, wherein when a write operation for $M^{th}$ subpage data of the first page data is completed, the cache buffer receives and caches $M^{th}$ subpage data of second page data from the controller, where M is a positive number less than N.

16 Claims, 13 Drawing Sheets

(56) References Cited

U.S. PATENT DOCUMENTS

| | | | |
|---|---|---|---|
| 2011/0222342 A1* | 9/2011 | Yoon | G11C 11/56 365/185.03 |
| 2014/0198580 A1* | 7/2014 | Grunzke | G11C 29/025 365/185.22 |
| 2015/0213895 A1* | 7/2015 | Kwak | G06F 12/0868 711/103 |
| 2015/0378887 A1* | 12/2015 | Lee | G11C 7/1039 711/103 |
| 2019/0065095 A1* | 2/2019 | Srinivasan | G06F 12/0246 |

* cited by examiner

DATA STORAGE DEVICE AND OPERATING METHOD THEREOF

CROSS-REFERENCES TO RELATED APPLICATION

The present application claims priority under 35 U.S.C. § 119(a) to Korean application number 10-2018-0113943, filed on Sep. 21, 2018, which is incorporated herein by reference in its entirety.

BACKGROUND

1. Technical Field

Various embodiments generally relate to a semiconductor device, and more particularly, to a data storage device and an operating method thereof.

2. Related Art

Recently, the paradigm for the computing environment has changed to the ubiquitous computing environment in which computer systems can be used anytime, anywhere. Therefore, the use of portable electronic devices such as a mobile phone, digital camera and notebook computer has rapidly increased. Such portable electronic devices generally use a data storage device using a memory device. The data storage device is used to store data used in the portable electronic device.

Since the data storage device using a memory device has no mechanical driver, the data storage device has excellent stability and durability, exhibits high information access speed, and has low power consumption. Examples of the data storage device having such advantages include a universal serial bus (USB) memory device, a memory card having various interfaces, a universal flash storage (UFS) device, and a solid state drive (SSD).

SUMMARY

Various embodiments are directed to a data storage device capable of improving the performance of a sequential program operation in a memory system, and an operating method thereof.

In an embodiment, a data storage device may include: a memory cell array including a plurality of pages each including K memory cells of which each stores N bits therein, where N and K are positive numbers greater than or equal to 2, wherein each of the pages stores one page data constituted by N sub page data each having K bits; a cache buffer configured to receive and cache N sub page data of first page data from a controller; and a page buffer configured to sequentially buffer the respective cached N sub page data of the first page data and store the respective buffered N subpage data of the first page data in the memory cell array. When a write operation for $M^{th}$ sub page data of the first page data is completed, the cache buffer may receive and caches $M^{th}$ sub page data of second page data from the controller, where M is a positive number less than N.

In an embodiment, there is provided an operating method of a memory device which includes a memory cell array including a plurality of pages each including K memory cells of which each stores N bits, where N and K are positive numbers greater than or equal to 2, wherein each of the pages stores one page data constituted by N sub page data each having K bits. The operating method may include the steps of: receiving and caching, by a cache buffer, N sub page data of first page data from controller; sequentially buffering, by a page buffer, the respective cached N sub page data of the first page data and storing the respective buffered N subpage data of the first page data in the memory cell array; and receiving and caching, by the cache buffer, $M^{th}$ sub page data of second page data from the controller, when a write operation for $M^{th}$ sub page data of the first page data is completed, where M is a positive number less than N.

In an embodiment, there is provided a data storage device comprising: a memory device including a plurality of memory cells; and a controller suitable for sequentially providing first data and second data to the memory device, each of first data and second data including multiple sub data corresponding to logic pages of the memory cells. The memory device includes a cache buffer coupled to the controller, suitable for sequentially receiving and caching the first data and the second data. The page buffer coupled between the cache buffer and the memory cells. And the memory controller controls the cache buffer and the page buffer such that a sub data of the second data to be stored in the memory cells is cached in the cache buffer, when a sub data of the first data buffered in the page buffer is stored in the memory cells.

The cache buffer may complete receiving and caching the $M^{th}$ sub page data of the second page data from controller, before storing the first page data in the memory cell array is completed.

The cache buffer may complete receiving and caching the $M^{th}$ sub page data of the second page data from controller, before a write operation for the cached $(M+1)^{th}$ sub page data of the first page data is completed.

The memory cell array may include a multi-level cell (MLC), and the N sub page data may include a least significant bit (LSB) page data and a most significant bit (MSB) page data. The page buffer may perform a write operation of storing the MSB page data in the memory cell array, after performing a write operation of storing the LSB page data in the memory cell array.

When the write operation of storing the LSB page data of the first page data in the memory cell array is completed, the cache buffer may receive and cache the LSB page data of the second page data from the controller.

The memory cell array may include a triple level cell (TLC), and the N sub page data may include a least significant bit (LSB) page data, a center significant bit (CSB) page data and a most significant bit (MSB) page data. The page buffer may perform a write operation of storing the LSB page data in the memory cell array, perform a write operation of storing the CSB page data in the memory cell array when the write operation for the LSB page data is completed, and perform a write operation of storing the MSB page data in the memory cell array when the write operation for the CSB page data is completed.

When the write operation of storing the LSB page data of the first page data in the memory cell array is completed, the cache buffer may receive and cache the LSB page data of the second page data from data controller.

When the write operation of storing the CSB page data of the first page data in the memory cell array is completed, the cache buffer may receive the CSB page data of the second page data from the data buffer and caches the received data.

DETAILED DESCRIPTION

Hereinafter, a data storage device and an operating method thereof according to the present disclosure will be described below with reference to the accompanying drawings through exemplary embodiments.

Figure 1:
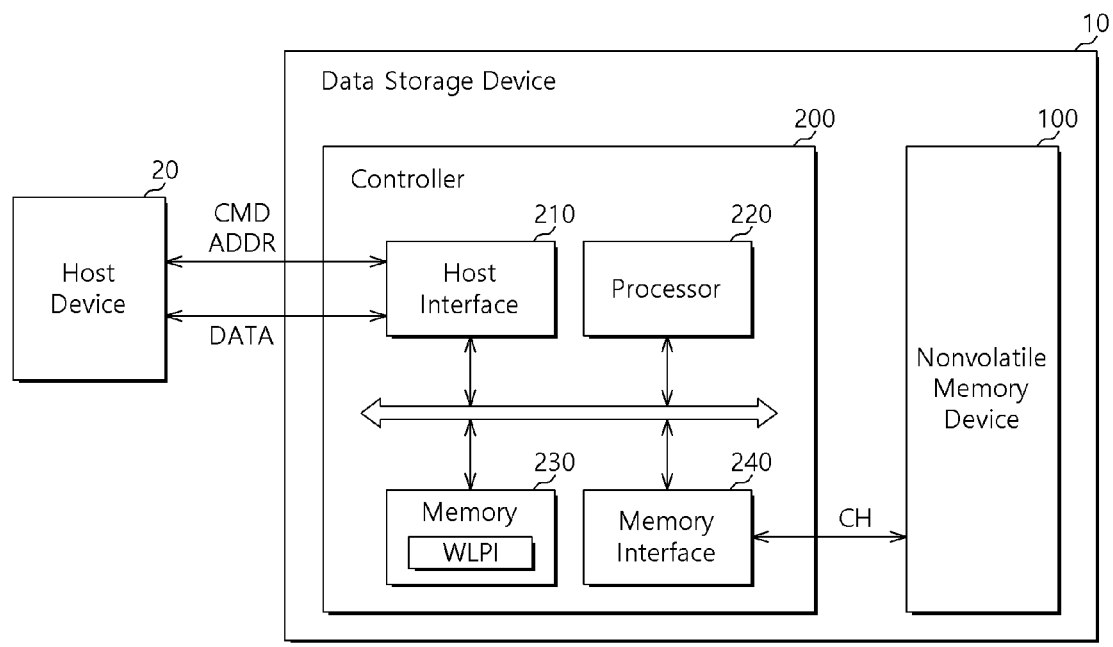
FIG. 1 is a diagram illustrating a data storage device in accordance with an embodiment.

FIG. 1 is a diagram illustrating a data storage device 10 in accordance with an embodiment.

Referring to FIG. 1, the data storage device 10 may store data accessed by a host device 20 such as a mobile phone, MP3 player, laptop computer, desktop computer, game machine, television (TV) or in-vehicle infotainment system. The data storage device 10 may be referred to as a memory system.

The data storage device 10 may be fabricated as any one of various types of storage devices depending on an interface protocol coupled to the host device 20. For example, the data storage device 10 may be configured as any one of various types of storage devices which include a solid state drive (SSD), a multimedia card (MMC) such as an eMMC, RS-MMC or micro-MMC, a secure digital (SD) card such as a mini-SD or micro-SD card, a universal serial bus (USB) storage device, a universal flash storage (UFS) device, a personal computer memory card international association (PCMCIA) card-type storage device, a peripheral component interconnection (PCI) card-type storage device, a PCI express (PCI-e or PCIe) card-type storage device, a compact flash (CF) card, a smart media card and a memory stick.

The data storage device 10 may be fabricated as any one of various types of packages. For example, the data storage device 10 may be fabricated as any one of various types of packages such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 10 may include a nonvolatile memory device 100 and a controller 200.

The nonvolatile memory device 100 may operate as a storage medium of the data storage device 10. The nonvolatile memory device 100 may be configured as any one of various types of nonvolatile memory devices including a NAND flash memory device, a NOR flash memory device, a ferroelectric random access memory (FRAM) using a ferroelectric capacitor, a magnetic RAM (MRAM) using a tunneling magneto-resistive (TMR) film, a phase change RAM (PRAM) using chalcogenide alloys, and a resistive RAM (ReRAM) using transition metal oxide, depending on memory cells.

Although FIG. 1 illustrates that the data storage device 10 includes one nonvolatile memory device 100, the data storage device 10 may include a plurality of nonvolatile memory devices. The present embodiment may be applied in the same manner to the data storage device 10 including a plurality of nonvolatile memory devices.

The nonvolatile memory device 100 may include a memory cell array (not illustrated) having a plurality of memory cells arranged at the respective intersections between a plurality of bit lines (not illustrated) and a plurality of word lines (not illustrated). The memory cell array may include a plurality of memory blocks, and each of the memory blocks may include a plurality of pages.

For example, each of the memory cells of the memory cell array may be configured as a single level cell (SLC) capable of storing 1-bit data or a multi-level cell (MLC) capable of storing 2 or more-bit data. The MLC may store 2-bit data, 3-bit data, 4-bit data or the like. In general, a memory cell for storing 2-bit data may be referred to as an MLC, a memory cell for storing 3-bit data may be referred to as a triple level cell (TLC), and a memory cell for storing 4-bit data may be referred to as a quadruple level cell (QLC). However, for convenience, the memory cells for storing 2-bit to 4-bit data will be collectively referred to as MLCs.

The memory cell array may include one or more of the SLC and the MLC. Furthermore, the memory cell array may include memory cells with a two-dimensional structure or memory cells with a three-dimensional structure.

The controller 200 may control overall operations of the data storage device 10 by driving firmware or software loaded to the memory 230. The controller 200 may decode and drive a code-based instruction or algorithm such as firmware or software. The controller 200 may be implemented in hardware or a combination of hardware and software.

The controller 200 may include a host interface 210, a processor 220, a memory 230, and a memory interface 240.

Although not illustrated in FIG. 1, the controller 200 may further include an error correction code (ECC) engine which generates parity data by performing ECC encoding on write data provided from the host device 20, and performs ECC decoding on read data read from the nonvolatile memory device 100 using the parity data.

The host interface 210 may interface the host device 20 and the data storage device 10 according to a protocol. For example, the host interface 210 may communicate with the host device 20 through any one protocol of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-e or PCIe).

The processor 220 may include a micro control unit (MCU) and/or a central processing unit (CPU). The processor 220 may process a request received from the host device 20. In order to process the request received from the host device 20, the processor 220 may drive a code-based instruction or algorithm loaded to the memory 230, i.e. firmware, and control the nonvolatile memory device 100 and internal function blocks such as the host interface 210, the memory 230 and the memory interface 240.

The processor 220 may generate control signals to control an operation of the nonvolatile memory device 100 based on requests received from the host device 20. Further, the processor 220 may provide the generated control signals to the nonvolatile memory device 100 through the memory interface 240.

The memory 230 may be configured as a random access memory (RAM) such as a dynamic RAM (DRAM) or static RAM (SRAM). The memory 230 may store the firmware driven by the processor 220. Furthermore, the memory 230 may store data required for driving the firmware, for example, metadata. That is, the memory 230 may operate as a working memory of the processor 220.

The memory 230 may include a data buffer for temporarily storing write data which are to be transferred from the host device 20 to the nonvolatile memory device 100 or read data which are to be transferred from the nonvolatile memory device 100 to the host device 20. That is, the memory 230 may operate as a buffer memory.

The memory interface 240 may control the nonvolatile memory device 100 under control of the processor 220. The memory interface 240 may also be referred to as a memory controller. The memory interface 240 may provide control signals to the nonvolatile memory device 100. The control signals may include a command, address and operation control signal for controlling the nonvolatile memory device 100. The memory interface 240 may provide data stored in the data buffer of the memory 230 to the nonvolatile memory device 100 or store data received from the nonvolatile memory device 100 in the data buffer.

Figure 2:
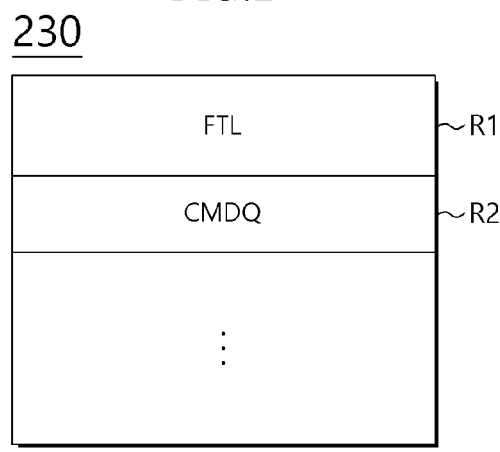
FIG. 2 is a diagram illustrating a memory of FIG. 1.

FIG. 2 is a diagram illustrating the memory 230 of FIG. 1.

Referring to FIG. 2, the memory 230 may include a first region R1 and a second region R2. The first region R1 may store a flash translation layer (FTL). The second region R2 may be used as a command queue CMDQ for queuing a command corresponding to a request received from the host device 20. Although FIG. 2 illustrates the memory 230 including two regions, in addition to the two regions, the memory 230 may include regions for various uses, such as a region used as a write data buffer for temporarily storing write data, a region used as a read data buffer for temporarily storing read data, and a region used as a map cache buffer for caching map data.

Referring back to FIG. 1, the memory 230 may include a region for storing system data or metadata. The region may store workload pattern information (WLPI).

When the nonvolatile memory device 100 is configured as a flash memory device, the processor 220 may control a unique operation of the nonvolatile memory device 100, and drive software referred to as the FTL in order to provide device compatibility to the host device 20. As the FTL is driven, the host device 20 may recognize and use the data storage device 10 as a general storage device such as a hard disk.

The FTL may be stored in the first region R1 of the memory 230. The FTL may include modules for performing various functions and metadata required for driving the respective modules. The FTL may be stored in a system region (not illustrated) of the nonvolatile memory device 100. When the data storage device 10 is powered on, the FTL may be read from the system region of the nonvolatile memory device 100, and loaded to the first region R1 of the memory 230.

Figure 3:
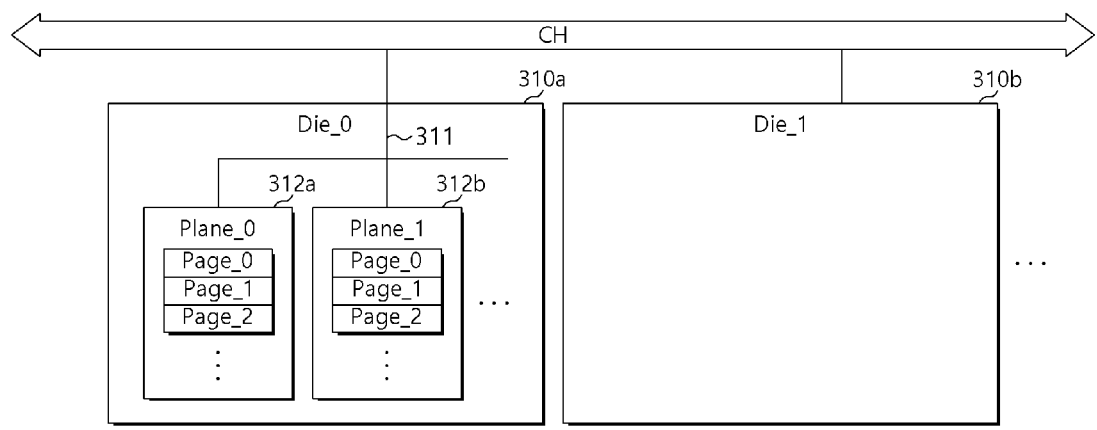
FIG. 3 is a diagram illustrating a data storage region included in a nonvolatile memory device in accordance with an embodiment.

FIG. 3 is a diagram illustrating a data storage region in a nonvolatile memory device (e.g., the nonvolatile memory device 100 of FIG. 1) in accordance with an embodiment.

Referring to FIG. 3, the nonvolatile memory device 100 may include a plurality of dies 310a and 310b which share a channel CH coupled to the controller 200. Each of the dies 310a and 310b may include a plurality of planes 312a and 312b which share a way 311 coupled to the channel CH. Each of the planes 312a and 312b may include a plurality of pages. Each of the pages may indicate the minimum unit of storage region from or to which data is read or written. A plurality of pages which are collectively erased may be referred to as a memory block. A plurality of memory blocks which are managed as one memory block may be referred to as a super block. The data storage region of the nonvolatile memory device 100 may be implemented with a die, a plane, a super block, a memory block, or a page. By way of example, in the following descriptions, the data storage region may be implemented with a page unless stated otherwise.

Figure 4:
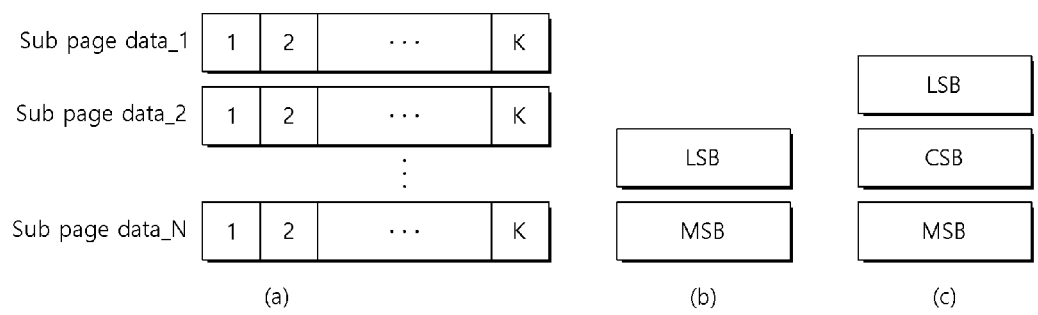
FIG. 4 is a diagram illustrating examples of page data stored in a page of FIG. 3.

FIG. 4 is a diagram illustrating examples of page data stored in a page of FIG. 3.

Referring to (a) of FIG. 4, a page includes K memory cells, each capable of storing N bits therein, where N and K are integers greater than or equal to 2. The page may store page data which can be constituted by a maximum of N subpage data. Each of the subpage data may correspond to data having a maximum of K bits.

Referring to (b) of FIG. 4, a page includes a plurality of memory cells each capable of storing two bits therein. Each of the memory cells corresponds to an MLC. Page data may include data of the least significant bit (LSB) page and data of the most significant bit (MSB) page as the subpage data corresponding to logic pages of the MLC.

Referring to (c) of FIG. 4, a page includes a plurality of memory cells each capable of storing three bits therein. Each of the memory cells corresponds to a TLC. Page data may include data of the LSB page, data of the center significant bit (CSB) page and data of the MSB page as subpage data corresponding to logic pages of the TLC.

Figure 5:
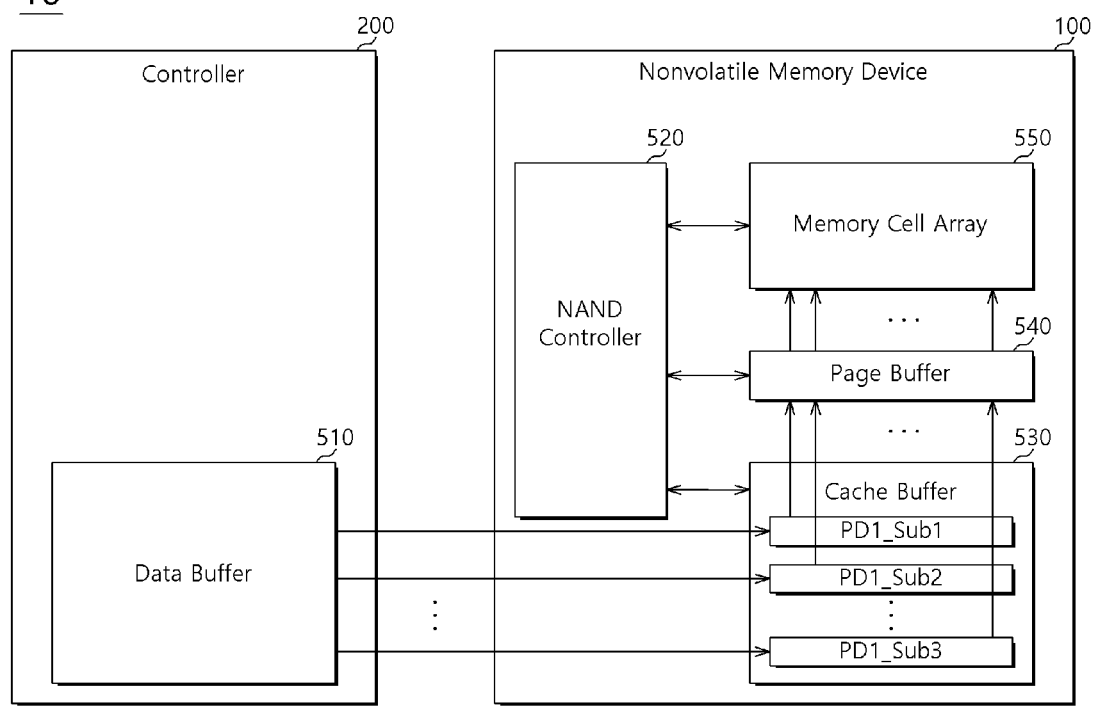
FIG. 5 is a diagram illustrating a sequential write operation of a data storage device in accordance with an embodiment.

FIG. 5 is a diagram illustrating a sequential write operation of a data storage device (e.g., the data storage device 10 of FIG. 1) in accordance with an embodiment.

Referring to FIG. 5, the data storage device 10 may include a nonvolatile memory device 100 and a controller 200. The nonvolatile memory device 100 may receive write data from the controller 200 and store the received data therein.

The controller 200 may include a data buffer 510 for temporarily storing write data which are to be stored in the nonvolatile memory device 100. The data buffer 510 may transfer the write data to the nonvolatile memory device 100.

The nonvolatile memory device 100 may include a NAND controller (or memory controller) 520, a cache buffer 530, a page buffer 540 and a memory cell array 550.

The NAND controller 520 may control overall operations of the nonvolatile memory device 100. Specifically, the NAND controller 520 may control the nonvolatile memory device 100 to perform an operation based on a command received from the controller 200 or other operations required for the nonvolatile memory device 100.

The cache buffer 530 may receive the write data which are to be stored in the nonvolatile memory device 100, and cache the received data. Specifically, the cache buffer 530 may receive the write data from the data buffer 510 in which the write data to be stored in the nonvolatile memory device 100 are temporarily stored, and cache the received data, under control of the NAND controller 520.

In an embodiment, the cache buffer 530 may separately receive each page data corresponding to the page unit. Page data may include N subpage data PD_Sub, where N is a positive number greater than or equal to 2. The cache buffer 530 may receive and store each of the subpage data. At this time, the size of the page data may be equal to K bits corresponding to the page size of the nonvolatile memory device 100, where K is a positive number greater than or equal to 2. The number N of subpage data constituting one page data may be equal to the number of bits which can be stored in each of the memory cells of the nonvolatile memory device 100.

When a write operation for $M^{th}$ subpage data of first page data is completed, the cache buffer 530 may cache $M^{th}$ subpage data of second page data. For example, the nonvolatile memory device 100 sequentially stores the first and second page data under control of the controller 200. The cache buffer 530 may receive the N subpage data constituting the first page data from the data buffer 510, and cache the received data. The page buffer buffers the cached data in the cache buffer 530. Specifically, the page buffer 540 may receive the cached N subpage data constituting the first page data from the cache buffer 530, and temporarily store the received data. The page buffer 540 may perform write operations of sequentially storing the temporarily stored N subpage data constituting the first page data to the memory cell array 550. When the page buffer 540 completes the write operation of storing the $M^{th}$ subpage data of the N subpage data constituting the first page data in the memory cell array 550, the cache buffer 530 may receive the $M^{th}$ subpage data of the N subpage data constituting the second page data from the data buffer 510, and cache the received data. That is, when the write operation of storing cached second subpage data of the first page data is completed, the cache buffer 530 may receive second subpage data of the second page data from the data buffer 510 and cache the received data.

In an embodiment, the page buffer 540 may receive the data cached in the cache buffer 530 for each subpage data, and perform write operations of sequentially storing the received subpage data in the memory cell array 550.

The memory cell array 550 may include a plurality of memory cells, and each of the memory cells may store N bits. Hereafter, the sequential write operation of the memory device 100 will be described in more detail with reference to FIGS. 6 to 10 by exemplifying when the first and second page data are sequentially stored.

Figure 6:
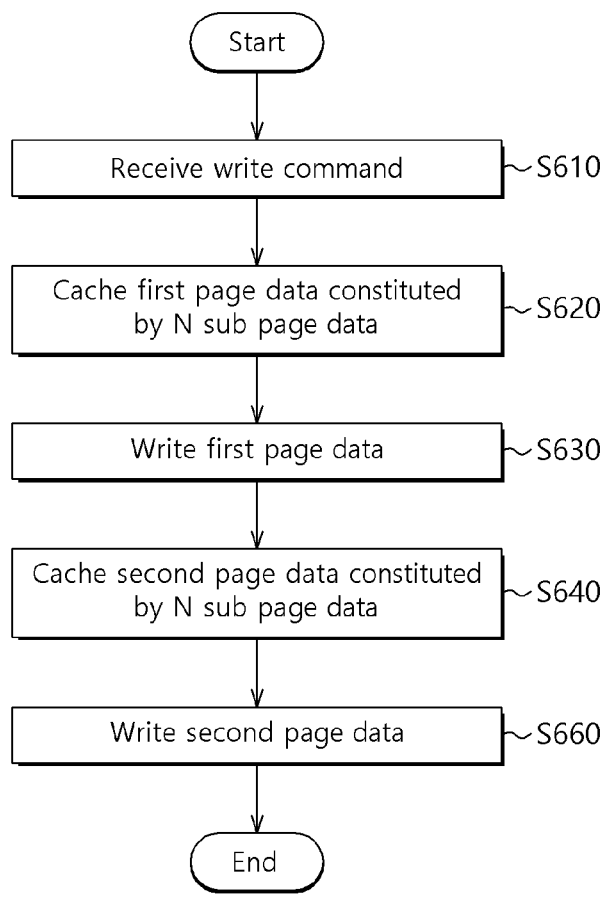
FIGS. 6 and 7 are diagrams illustrating a conventional sequential write operation.
Figure 7:
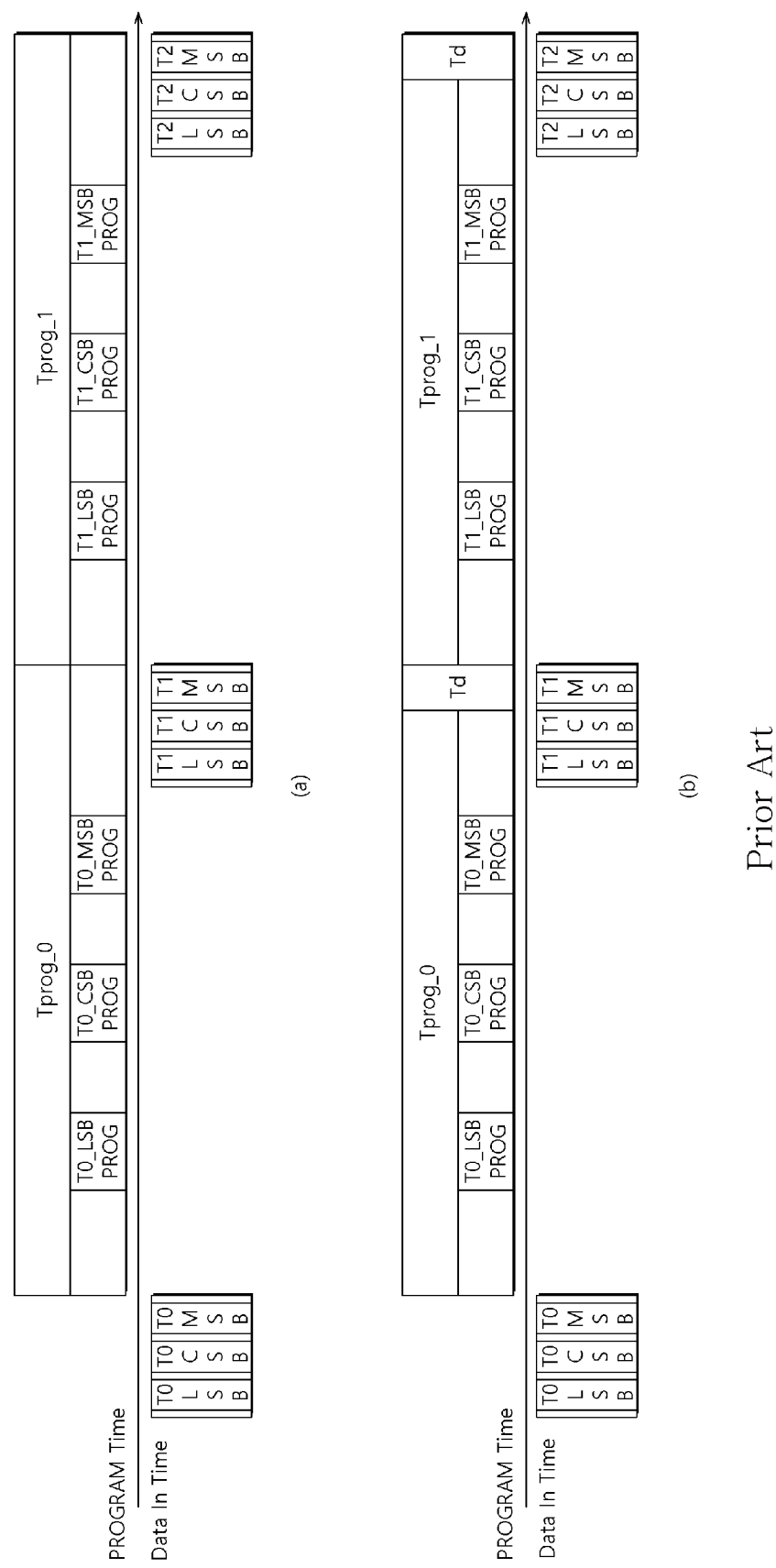

FIGS. 6 and 7 are diagrams illustrating a conventional sequential write operation of a data storage device. The sequential write operation may be performed by the data storage device 10 including the nonvolatile memory device 100 and the controller 200 in FIG. 5.

Referring to FIG. 6, at step S610, the nonvolatile memory device 100 may receive a write command. Specifically, the nonvolatile memory device 100 may receive a write command for sequentially storing first and second page data from the controller 200.

At step S620, the first page data may be cached in the cache buffer 530. Specifically, the cache buffer 530 may receive N subpage data constituting the first page data from the controller 200, and cache the received data.

At step S630, the first page data may be stored in the page buffer 540. Specifically, when the cache buffer 530 completes the operation of caching the N subpage data constituting the first page data, the page buffer 540 may receive the N subpage data constituting the first page data from the cache buffer 530. The page buffer 540 may perform write operations of sequentially storing the received N subpage data constituting the first page data in the memory cell array 550.

At step S640, the second page data may be cached in the cache buffer 530. Specifically, when the operation of storing the first page data in the memory cell array 550 is completed, the cache buffer 530 may receive the second page data constituted by N subpage data from the controller 200, and cache the received data.

That is, during the sequential write operation, the cache buffer 530 may cache the second page data after the write operations for all of the N subpage data constituting the first page data are completed.

At step S650, the second page data may be stored in the page buffer 540. Specifically, when the cache buffer 530 completes the operation of caching the N subpage data constituting the second page data, the page buffer 540 may receive the N subpage data constituting the second page data from the cache buffer 530. The page buffer 540 may perform write operations of sequentially storing the received N subpage data constituting the second page data in the memory cell array 550.

FIG. 7 is a timing diagram illustrating a sequential write operation on a memory cell as a triple level cell (TLC).

(a) of FIG. 7 is a timing diagram illustrating the case in which the data storage device 10 ideally operates during the sequential write operation of FIG. 6. In (a) of FIG. 7, "Data In Time" represents the time at which write data is cached in the cache buffer 530 from the controller 200, and "PROGRAM Time" represents the time at which the data cached in the cache buffer 530 is completely written to the memory cell array 550. When the data storage device 10 performs a sequential write operation (e.g., Tprog_0 or Tprog_1) of storing write data in the nonvolatile memory device 100 in which no delay occurs, the second page data (e.g., T1 LSB, T1 CSB, T1 MSB) from the controller 200 may be cached in the cache buffer 530 when the first page data (e.g., T0LSB, T0CSB, T0MSB) is cached in the cache buffer 530 and the write operation (e.g., Tprog_0) of storing the cached first page data in the memory cell array 550 is completed. When the N sub page data (e.g., T1 LSB, T1 CSB, T1 MSB) constituting the second page data are all cached, the data storage device 10 may start a write operation of storing the cached second page data in the memory cell array 550.

(b) of FIG. 7 is a timing diagram illustrating the case in which delay occurs in the data storage device 10 during the sequential write operation of FIG. 6. After a write operation (e.g., Tprog_0) of storing the first page data (e.g., T0LSB, T0CSB, T0MSB) in the memory cell array 550 is completed, the data storage device 10 may start an operation of caching the second page data (e.g., T1 LSB, T1 CSB, T1 MSB) from the controller 200 in the cache buffer 530. After the N subpage data (e.g., T1 LSB, T1 CSB, T1 MSB) constituting the second page data are all cached, the data storage device 10 may start a write operation of storing the second page data in the memory cell array 550. When a delay occurs while the second page data from the controller 200 are cached in the cache buffer 530, the write operation of storing the second data in the memory cell array 550 may be delayed by a time Td.

Embodiments of the present disclosure provide a technique capable of caching each subpage data constituting second page data whenever a write operation of storing each subpage data constituting first page data in the memory cell array 550 is completed, thereby preventing degradation in write operation performance, which may be caused by a delay.

Figure 8:
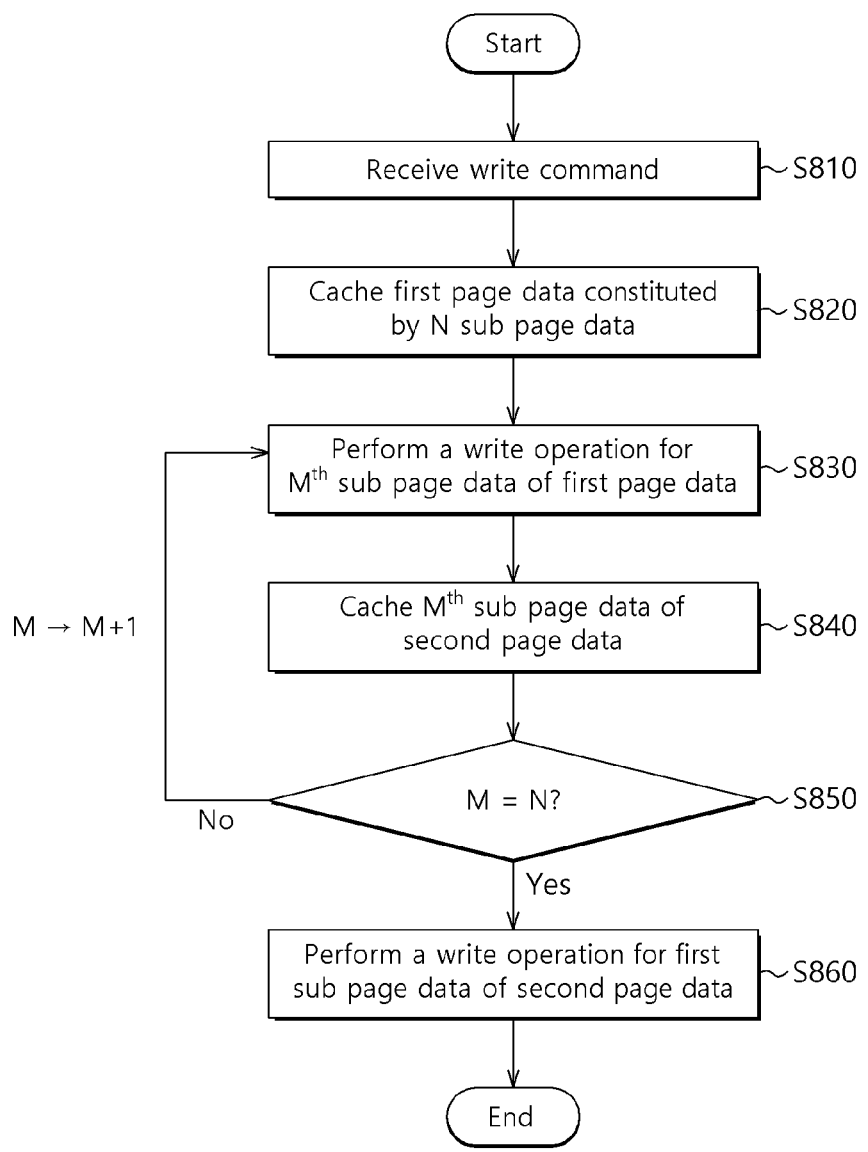
FIG. 8 is a flowchart illustrating an operating method of a data storage device in accordance with an embodiment.

FIG. 8 is a flowchart illustrating an operating method of a data storage device in accordance with an embodiment.

The operating method of FIG. 8 will be described by exemplifying when first and second page data are sequentially received and stored in the nonvolatile memory device 100 of FIG. 5.

Referring to FIG. 8, at step S810, the nonvolatile memory device 100 may receive a write command. Specifically, the nonvolatile memory device 100 may receive a write command from the controller 200. Through the write command, the controller 200 may control the nonvolatile memory device 100 to store write data, which are temporarily stored in the data buffer 510, into the memory cell array 550.

At step S820, the first page data may be cached in the cache buffer 530. Specifically, the cache buffer 530 may receive the N subpage data constituting the first page data from the data buffer 510 of the controller 200, and cache the received data therein.

At step S830, a write operation may be performed. Specifically, when the cache buffer 530 completes the operation of caching the N subpage data constituting the first page data, the page buffer 540 may receive the N subpage data constituting the first page data from the cache buffer 530. Then, the page buffer 540 may perform write operations of sequentially storing the N subpage data constituting the first page data in the memory cell array 550.

In an embodiment, when the memory cell array 550 includes memory cells implemented with multi-level cells (MLCs), the page buffer 540 may perform a write operation for a certain subpage (e.g., least significant bit (LSB) page). When the write operation for the LSB page is completed, the page buffer 540 may perform a write operation for another subpage (e.g., most significant bit (MSB) page).

In an embodiment, when the memory cell array 550 includes memory cells implemented with triple-level cells (TLCs), the page buffer 540 may perform a write operation for a certain subpage (e.g., least significant bit (LSB) page). When the write operation for the LSB page is completed, the page buffer 540 may perform a write operation for another subpage (e.g., center significant bit (CSB) page). When the write operation for the CSB is completed, the page buffer 540 may perform a write operation for another subpage (e.g., most significant bit (MSB) page).

At step S840, the second page data may be cached in the cache buffer 530. Specifically, when the page buffer 540 completes a write operation for first subpage data constituting the first page data, the cache buffer 530 may receive first subpage data constituting the second page data from the controller 200, and cache the received data therein. That is, the first subpage data of the N subpage data constituting the first page data which have been cached in the cache buffer 530 may be replaced with the first subpage data of the N subpage data constituting the second page data.

In an embodiment, when a write operation for subpage data corresponding to the LSB page of the first page data is completed in the case where the memory cells are implemented with MLCs, the cache buffer 530 may receive subpage data corresponding to the LSB page of the second page data from the data buffer 510 and cache the received data, even before a write operation for subpage data corresponding to the MSB page of the first page data is completed.

In an embodiment, when a write operation for subpage data corresponding to the LSB page of the first page data is completed in the case where the memory cells are implemented with TLCs, the cache buffer 530 may receive subpage data corresponding to the LSB page of the second page data from the data buffer 510 and cache the received data, even before write operations for subpage data corresponding to the CSB and MSB pages of the first page data are completed. Furthermore, when the write operation for subpage data corresponding to the CSB page of the first page data is completed, the cache buffer 530 may receive subpage data corresponding to the CSB page of the second page data from the data buffer 510 and cache the received data, even before a write operation for subpage data corresponding to the MSB page of the first page data is completed.

At step S850, it is determined that the write operation for the first page data may be completed. Specifically, the nonvolatile memory device 100 may repeat steps S830 and S840 unti-l the write operations for all of the subpage data (e.g., N subpage data) of the first page data are completed. In other words, at step S850, it is determined that whether current $M^{th}$ subpage data of the first page data is identical to Nth subpage data of the first page data. When it is determined that Mth subpage data is identical to Nth subpage data, step S860 may be performed. Otherwise, step S830 may be performed for increased subpage data, i.e., (M+1)th subpage data.

At step S860, a write operation for the second page data may be performed. When a write operation for $N^{th}$ subpage data constituting the first data page is completed, the nonvolatile memory device 100 may perform a write operation for first subpage data of the second page data cached in the cache buffer 530.

That is, whenever any one of N subpage data constituting page data corresponding to an operation target is stored in the memory cell array 550, an operation of caching subpage data constituting the next page data to be stored may be performed. Thus, when the operation of storing $N^{th}$ subpage data in the memory cell array 550 is completed, the subpage data constituting the next page data to be stored may be cached in the cache buffer 530, except the $N^{th}$ subpage data. Therefore, when receiving only the $N^{th}$ subpage data constituting the next page data to be stored from the controller 200 and caching the received data, the nonvolatile memory device may start the write operation of storing the next page data to be stored in the memory cell array 550. Accordingly, it may be possible to reduce degradation in performance of the data storage device 10 although delay occurs to some extent.

Figure 9:
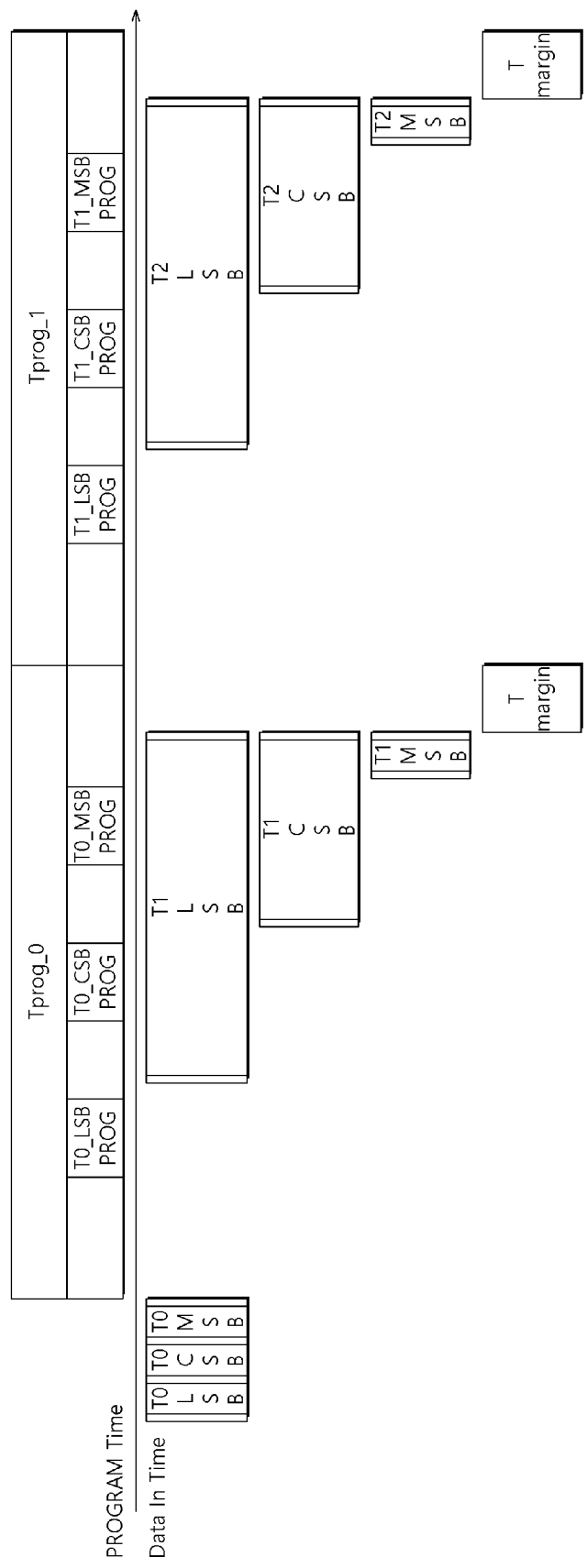
FIGS. 9 and 10 are timing diagrams illustrating an operation of a data storage device of FIG. 8.
Figure 10:
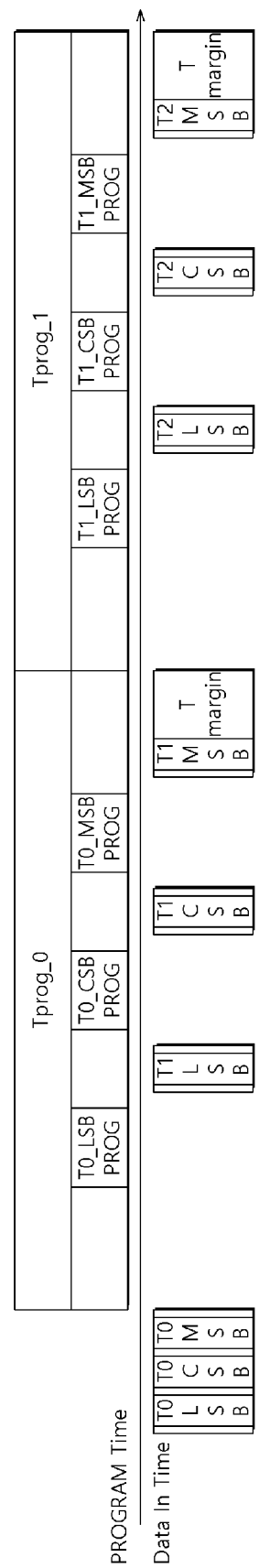

FIGS. 9 and 10 are timing diagrams illustrating an operation of a data storage device in accordance with an embodiment, the operation of the data storage device 10, which is illustrated in FIG. 8.

In the following descriptions, a sequential program operation may indicate an operation of sequentially storing first page data T0_LSB, T0_CSB and T0_MSB, second page data T1_LSB, T1_CSB and T1_MSB and third page data T2_LSB, T2_CSB and T2_MSB in the nonvolatile memory device 100, when the memory cells are implemented with triple level cells (TLCs). T0_LSB, T0_CSB and T0_MSB may be subpage data (i.e., LSB subpage, CSB subpage and MSB subpage) of the first page data. T1_LSB, T1_CSB and T1_MSB may be subpage data of the second page data. T2_LSB, T2_CSB and T2_MSB may be subpage data of the third page data.

FIG. 9 is a timing diagram illustrating a sequential program operation in accordance with the present embodiment, for example, the sequential program operation of FIG. 8. Whenever the write operation for each subpage data of the first page data is completed, the nonvolatile memory device 100 may receive corresponding subpage data of the second page data from the data buffer 510, and cache the received data. Therefore, subpage data (e.g., data of the LSB, CSB and MSB subpages) of the second page data may be cached at different times. However, the nonvolatile memory device 100 may completely cache data of the LSB and CSB subpages of the second page data before the write operation for data of the MSB page of the first page data is completed. Thus, although a delay occurs during the process of receiving data from the data buffer 510 and caching the received data, a delay of the write operation for the second page data may be minimized.

FIG. 10 is a timing diagram illustrating a sequential program operation in accordance with another embodiment, for example, the sequential program operation of FIG. 8. Referring to FIG. 10, whenever the write operation for each subpage data of the first page data is completed, the nonvolatile memory device 100 may receive corresponding subpage data of the second page data from the data buffer 510, and cache the received data.

The timing diagrams of FIGS. 9 and 10 are only examples of the operation of caching the subpage data of the second page data. Thus, the timing diagrams may be modified in various manners within such a range that does not delay the program operation of the second page data.

Figure 11:
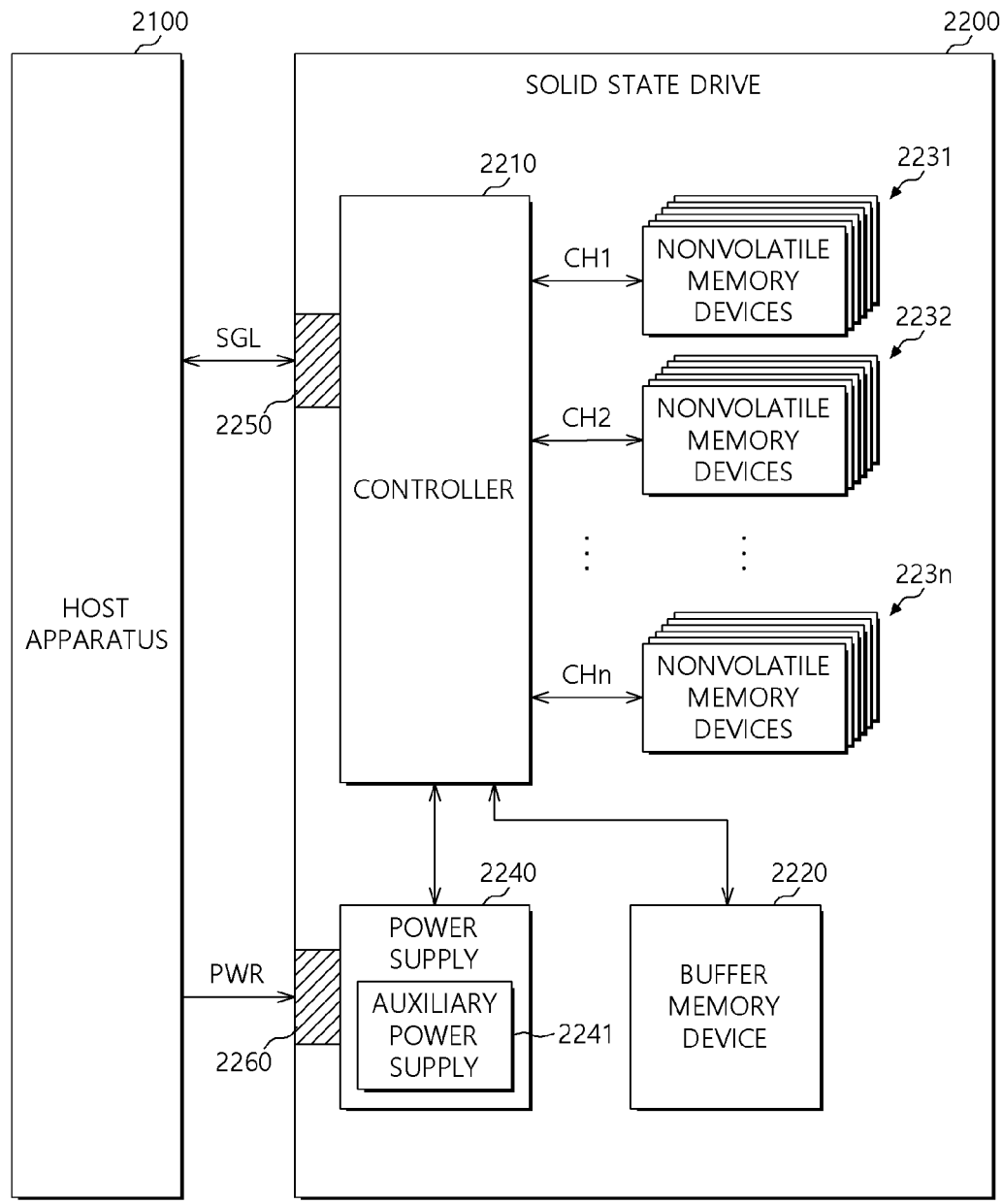
FIG. 11 is a diagram illustrating a data processing system including a solid state drive (SSD) in accordance with an embodiment.

FIG. 11 illustrates a data processing system including a solid state drive (SSD) 2200 in accordance with an embodiment. Referring to FIG. 11, the data processing system 2000 may include a host device 2100 and the SSD 2200.

The SSD 2200 may include a controller 2210, a buffer memory device 2220, nonvolatile memory devices 2231 to 223n, a power supply 2240, a signal connector 2250 and a power connector 2260.

The controller 2210 may control overall operations of the SSD 2200.

The buffer memory device 2220 may temporarily store data which are to be stored in the nonvolatile memory devices 2231 to 223n. Furthermore, the buffer memory device 2220 may temporarily store data read from the nonvolatile memory devices 2231 to 223n. The data which are temporarily stored in the buffer memory device 2220 may be transferred to the host device 2100 or the nonvolatile memory devices 2231 to 223n under control of the controller 2210.

The nonvolatile memory devices 2231 to 223n may be used as storage media of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to one channel may be coupled to the same signal bus and data bus.

The power supply 2240 may provide power PWR inputted through the power connector 2260 into the SSD 2200. The power supply 2240 may include an auxiliary power supply 2241. The auxiliary power supply 2241 may supply power to normally turn off the SSD 2200, when a sudden power off occurs. The auxiliary power supply 2241 may include large capacitors capable of storing power PWR.

The controller 2210 may exchange signals SGL with the host device 2100 through the signal connector 2250. The signal SGL may include a command, address, data and the like. The signal connector 2250 may be configured as various types of connectors depending on an interface method between the host device 2100 and the SSD 2200.

Figure 12:
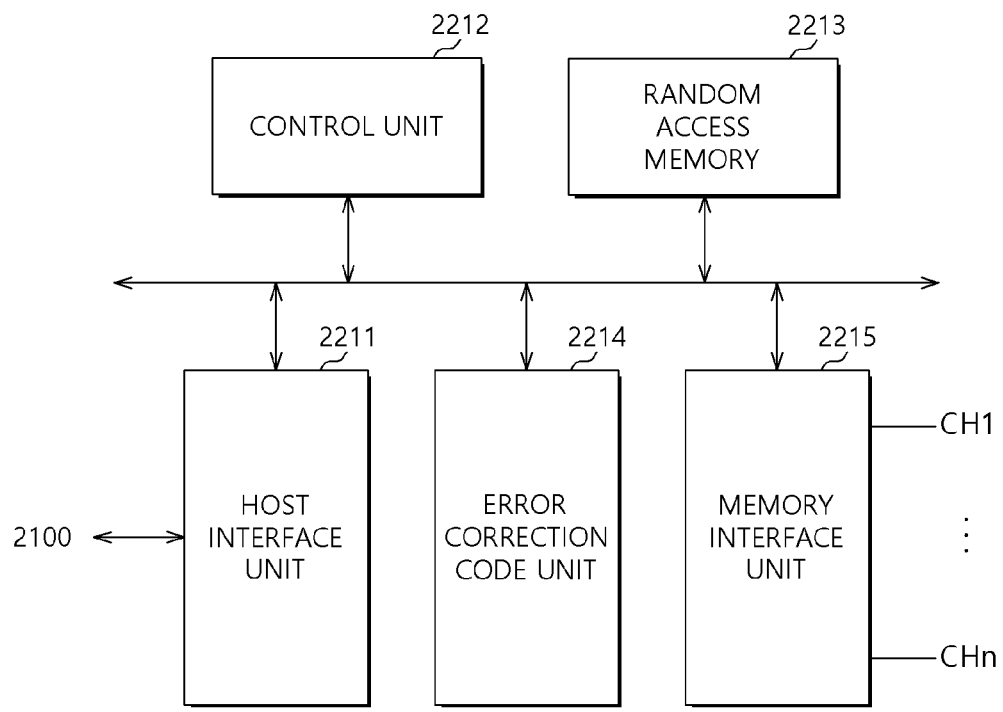
FIG. 12 is a diagram illustrating a controller of FIG. 11.

FIG. 12 illustrates the controller 2210 of FIG. 11. Referring to FIG. 12, the controller 2210 may include a host interface unit 2211, a control unit 2212, a random access memory (RAM) 2213, an error correction code (ECC) unit 2214 and a memory interface unit 2215.

The host interface unit 2211 may interface the host device 2100 and the SSD 2200 according to a protocol of the host device 2100. For example, the host interface unit 2211 may communicate with the host device 2100 through any one protocol of secure digital, Universal Serial Bus (USB), Multi-Media Card (MMC), Embedded MMC (eMMC), Personal Computer Memory Card International Association (PCMCIA), Parallel Advanced Technology Attachment (PATA), Serial Advanced Technology Attachment (SATA), Small Computer System Interface (SCSI), Serial Attached SCSI (SAS), Peripheral Component Interconnection (PCI), PCI Express (PCIe) and Universal Flash Storage (UFS). The host interface unit 2211 may perform a disk emulation function which supports the host device 2100 to recognize the SSD 2200 as a universal data storage device, for example, a hard disk drive (HDD).

The control unit 2212 may analyze and process the signal SGL inputted from the host device 2100. The control unit 2212 may control operations of internal function blocks according to firmware or software for driving the SSD 2200. The RAM 2213 may be used as a working memory for driving such firmware or software.

The ECC unit 2214 may generate parity data of the data which are to be transferred to the nonvolatile memory devices 2231 to 223n. The generated parity data and the data may be stored in the nonvolatile memory devices 2231 to 223n. The ECC unit 2214 may detect an error of data read from the nonvolatile memory devices 2231 to 223n based on the parity data. When the detected error falls within a correctable range, the ECC unit 2214 may correct the detected error.

The memory interface unit 2215 may provide a control signal such as a command and address to the nonvolatile memory devices 2231 to 223n, under control of the control unit 2212. The memory interface unit 2215 may exchange data with the nonvolatile memory devices 2231 to 223n, under control of the control unit 2212. For example, the memory interface unit 2215 may provide data stored in the buffer memory device 2220 to the nonvolatile memory devices 2231 to 223n, or provide data read from the nonvolatile memory devices 2231 to 223n to the buffer memory device 2220.

Figure 13:
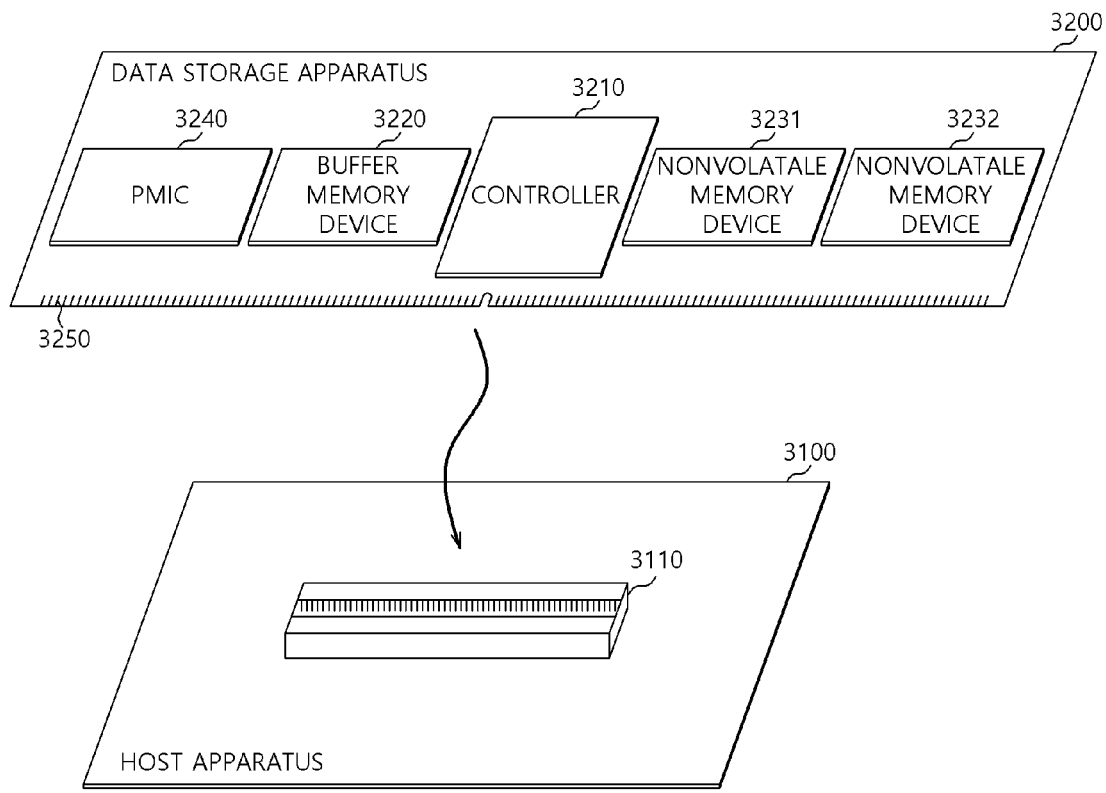
FIG. 13 is a diagram illustrating a data processing system including a data storage device in accordance with an embodiment.

FIG. 13 illustrates a data processing system 3000 including a data storage device in accordance with an embodiment. Referring to FIG. 13, the data processing system 3000 may include a host device 3100 and a data storage device 3200.

The host device 3100 may be configured as a board such as a PCB. Although not illustrated, the host device 3100 may include internal function blocks for performing a function of the host device.

The host device 3100 may include a connection terminal 3110 such as a socket, slot, or connector. The data storage device 3200 may be mounted on the connection terminal 3110.

The data storage device 3200 may be configured as a board such as a PCB. The data storage device 3200 may be referred to as a memory module or memory card. The data storage device 3200 may include a controller 3210, a buffer memory device 3220, nonvolatile memory devices 3231 and 3232, a power management integrated circuit (PMIC) 3240 and a connection terminal 3250.

The controller 3210 may control overall operations of the data storage device 3200. The controller 3210 may be configured in the same manner as the controller 2210 illustrated in FIG. 12.

The buffer memory device 3220 may temporarily store data which are to be stored in the nonvolatile memory devices 3231 and 3232. Furthermore, the buffer memory device 3220 may temporarily store data read from the nonvolatile memory devices 3231 and 3232. The data which are temporarily stored in the buffer memory device 3220 may be transferred to the host device 3100 or the nonvolatile memory devices 3231 and 3232 under control of the controller 3210.

The nonvolatile memory devices 3231 to 3232 may be used as storage media of the data storage device 3200.

The PMIC 3240 may provide power inputted through the connection terminal 3250 into the data storage device 3200. The PMIC 3240 may manage the power of the data storage device 3200 under control of the controller 3210.

The connection terminal 3250 may be coupled to the connection terminal 3110 of the host device 3100. Through the connection terminal 3250, signals and power may be transferred between the host device 3100 and the data storage device 3200, the signals including a command, address, data and the like. The connection terminal 3250 may be configured in various manners depending on an interface method between the host device 3100 and the data storage device 3200. The connection terminal 3250 may be disposed at any one side of the data storage device 3200.

Figure 14:
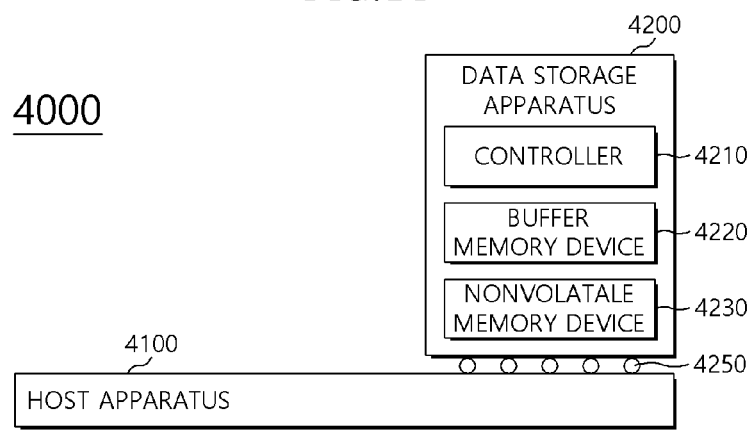
FIG. 14 is a diagram illustrating a data processing system including a data storage device in accordance with an embodiment.

FIG. 14 illustrates a data processing system 4000 including a data storage device in accordance with an embodiment. Referring to FIG. 14, the data processing system 4000 may include a host device 4100 and a data storage device 4200.

The host device 4100 may be configured as a board such as a PCB. Although not illustrated, the host device 4100 may include internal function blocks for performing a function of the host device.

The data storage device 4200 may be configured as a surface mount package. The data storage device 4200 may be mounted on the host device 4100 through solder balls 4250. The data storage device 4200 may include a controller 4210, a buffer memory device 4220 and a nonvolatile memory device 4230.

The controller 4210 may control overall operations of the data storage device 4200. The controller 4210 may be configured in the same manner as the controller 2210 illustrated in FIG. 12.

The buffer memory device 4220 may temporarily store data which are to be stored in the nonvolatile memory device 4230. Furthermore, the buffer memory device 4220 may temporarily store data read from the nonvolatile memory device 4230. The data which are temporarily stored in the buffer memory device 4220 may be transferred to the host device 4100 or the nonvolatile memory device 4230 under control of the controller 4210.

The nonvolatile memory device 4230 may be used as a storage medium of the data storage device 4200.

Figure 15:
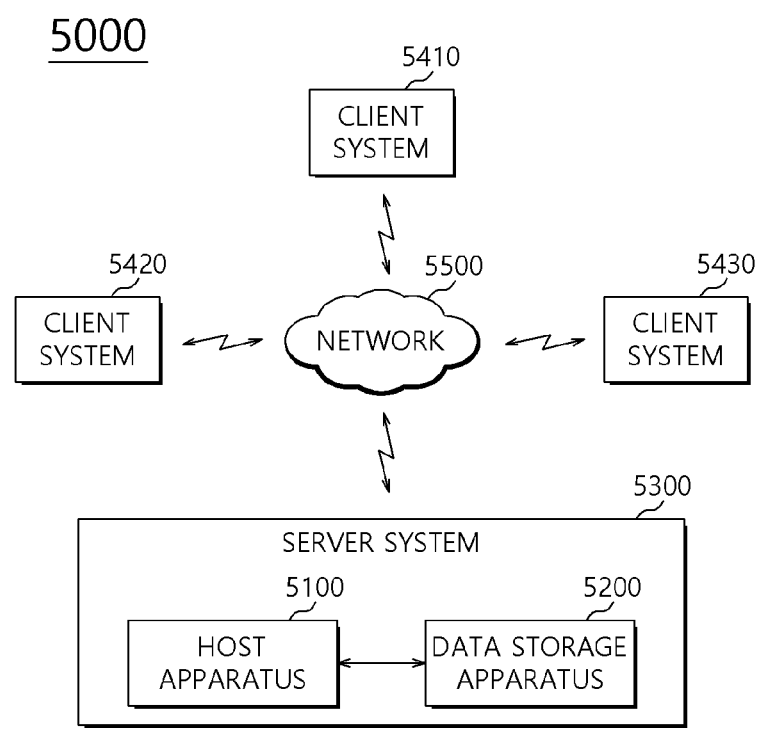
FIG. 15 is a diagram illustrating a network system including a data storage device in accordance with an embodiment.

FIG. 15 illustrates a network system 5000 including a data storage device in accordance with an embodiment of the present invention. Referring to FIG. 15, the network system 5000 may include a server system 5300 and a plurality of client systems 5410, 5420 and 5430 which are connected through a network 5500.

The server system 5300 may provide data in response to requests of the plurality of client systems 5410, 5420 and 5430. For example, the server system 5300 may store data provided from the plurality of client systems 5410, 5420 and 5430. For another example, the server system 5300 may provide data to the plurality of client systems 5410, 5420 and 5430.

The server system 5300 may include a host device 5100 and a data storage device 5200. The data storage device 5200 may be configured as the data storage device 10 of FIG. 1, the SSD 2200 of FIG. 11, the data storage device 3200 of FIG. 13 or the data storage device 4200 of FIG. 14.

Figure 16:
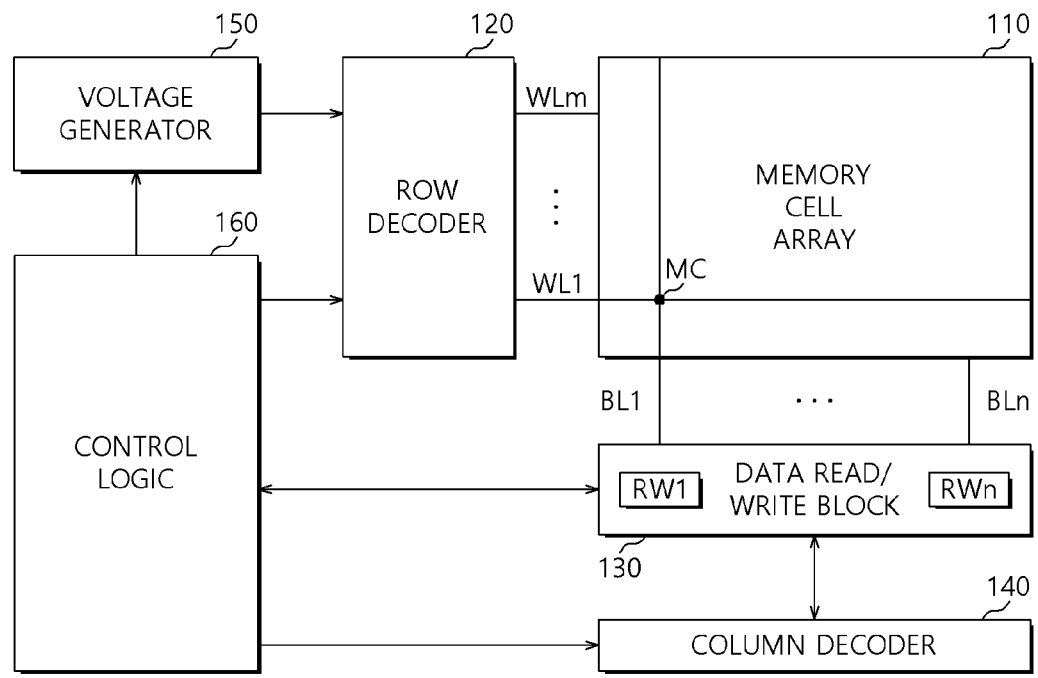
FIG. 16 is a block diagram illustrating a nonvolatile memory device in a data storage device in accordance with an embodiment.

FIG. 16 is a block diagram illustrating a nonvolatile memory device 100 in a data storage device in accordance with an embodiment. Referring to FIG. 16, the nonvolatile memory device 100 may include a memory cell array 110, a row decoder 120, a column decoder 130, a data read and write (read/write) block 140, a voltage generator 150 and a control logic 160.

The memory cell array 110 may include memory cells MC arranged at the respective intersections between word lines WL1 to WLm and bit lines BL1 to BLn.

The row decoder 120 may be coupled to the memory cell array 110 through the word lines WL1 to WLm. The row decoder 120 may operate under control of the control logic 160. The row decoder 120 may decode an address provided from an external device (not illustrated). The row decoder 120 may select and drive the word lines WL1 to WLm based on the decoding result. For example, the row decoder 120 may provide word line voltages provided from the voltage generator 150 to the word lines WL1 to WLm.

The data read/write block 140 may be coupled to the memory cell array 110 through the bit line BL1 to BLn. The data read/write block 140 may include read/write circuits RW1 to RWn corresponding to the respective bit line BL1 to BLn. The data read/write block 140 may operate under control of the control logic 160. The data read/write block 140 may operate as a write driver or sense amplifier depending on operation modes. For example, the data read/write block 140 may operate as a write driver which stores data provided from the external device in the memory cell array 110, during a write operation. For another example, the data read/write block 140 may operate as a sense amplifier which reads data from the memory cell array 110, during a read operation.

The column decoder 130 may operate under control of the control logic 160. The column decoder 130 may decode an address provided from the external device. The column decoder 130 may couple the read/write circuits RW1 to RWn of the data read/write block 140, corresponding to the respective bit lines BL1 to BLn, to a data input/output line (or data input/output buffer) according to the decoding result.

The voltage generator 150 may generate a voltage which is used for an internal operation of the nonvolatile memory device 100. The voltages generated by the voltage generator 150 may be applied to the memory cells of the memory cell array 110. For example, a program voltage generated during a program operation may be applied to a word line of memory cells on which the program operation is to be performed. For another example, an erase voltage generated during an erase operation may be applied to well regions of memory cells on which the erase operation is to be performed. For another example, a read voltage generated during a read operation may be applied to a word line of memory cells on which the read operation is to be performed.

The control logic 160 may control overall operations of the nonvolatile memory device 100 based on a control signal provided from the external device. For example, the control logic 160 may control an operation of the nonvolatile memory device 100, such as a read, write or erase operation of the nonvolatile memory device 100.

In accordance with the present embodiments, it is possible to improve the sequential program performance of the memory system.

While various embodiments have been described above, it will be understood to those skilled in the art that the embodiments described are examples only. Accordingly, the data storage device and the operating method which are described herein should not be limited based on the described embodiments. It should be understood that many variations and modifications of the basic inventive concept described herein will still fall within the spirit and scope of the present disclosure as defined in the following claims.

What is claimed is:

1. A data storage device comprising:
a memory cell array comprising a plurality of pages each including a plurality of memory cells of which each stores multiple bits therein, wherein each of the pages stores one page data constituted by a plurality of subpage data;
a cache buffer configured to receive and cache a plurality of subpage data of first page data from a controller; and
a page buffer configured to sequentially buffer the respective cached subpage data of the first page data and store the respective buffered subpage data of the first page data in the memory cell array,
wherein when a write operation for $M^{th}$ subpage data of the first page data is completed, the cache buffer receives and caches $M^{th}$ subpage data of second page data from the controller, where M is an integer greater than or equal to 1, and is less than a number of the plurality of subpage data.

2. The data storage device according to claim 1, wherein the cache buffer completes receiving and caching the $M^{th}$ subpage data of the second page data from the controller, before storing the first page data in the memory cell array is completed.

3. The data storage device according to claim 1, wherein the cache buffer completes receiving and caching the $M^{th}$ subpage data of the second page data from the controller, before a write operation for the cached $(M+1)^{th}$ subpage data of the first page data is completed.

4. The data storage device according to claim 1, wherein N is 2, the memory cell array includes a multi-level cell (MLC), and the plurality of subpage data includes a least significant bit (LSB) page data and a most significant bit (MSB) page data,
wherein a write operation of storing the MSB page data in the memory cell array is performed, after a write operation of storing the LSB page data in the memory cell array is performed.

5. The data storage device according to claim 4, wherein when the write operation of storing the LSB page data of the first page data in the memory cell array is completed, the cache buffer receives and caches the LSB page data of the second page data from the controller.

6. The data storage device according to claim 1, wherein the memory cell array includes a triple level cell (TLC), and the plurality subpage data includes a least significant bit (LSB) page data, a center significant bit (CSB) page data and a most significant bit (MSB) page data,
wherein a write operation of storing the LSB page data in the memory cell array is performed, and a write operation of storing the CSB page data in the memory cell array is performed when the write operation for the LSB page data is completed, and a write operation of storing the MSB page data is performed in the memory cell array when the write operation for the CSB page data is completed.

7. The data storage device according to claim 6, wherein when the write operation of storing the LSB page data of the first page data in the memory cell array is completed, the cache buffer receives and caches the LSB page data of the second page data from the controller.

8. The data storage device according to claim 7, wherein when the write operation of storing the CSB page data of the first page data in the memory cell array is completed, the cache buffer receives the CSB page data of the second page data from the controller and caches the received data.

9. An operating method of a memory device which comprises a memory cell array including a plurality of pages each including a plurality of memory cells of which each stores multiple bits, wherein each of the pages stores one page data constituted by a plurality of subpage data, the operating method comprising:
receiving and caching, by a cache buffer, a plurality of subpage data of first page data from a controller;
sequentially buffering, by a page buffer, the respective cached subpage data of the first page data and storing the respective buffered subpage data of the first page data in the memory cell array; and
receiving and caching, by the cache buffer, $M^{th}$ sub page data of second page data from the controller, when a write operation for $M^{th}$ sub page data of the first page data is completed, where M is an integer greater than or equal to 1, and is less than a number of the plurality of subpage data.

10. The operating method according to claim 9, wherein the receiving and caching of the $M^{th}$ sub page data of the second page data comprises receiving and caching the $M^{th}$ sub page data of the second page data from the controller, before storing the first page data in the memory cell array is completed.

11. The operating method according to claim 9, wherein receiving and caching the $M^{th}$ subpage data of the second page data from the controller are completed, before a write operation for the cached $(M+1)^{th}$ subpage data of the first page data is completed.

12. The operating method according to claim 9, wherein the memory cell array is a multi-level cell (MLC), and the plurality of subpage data includes a least significant bit (LSB) page data and a most significant bit (MSB) page data,
wherein storing the MSB page data in the memory cell array is performed, after storing the LSB page data in the memory cell array is performed.

13. The operating method according to claim 12, wherein receiving and caching the LSB page data of the second page data from the controller are performed, when storing the LSB page data of the first page data in the memory cell array is completed.

14. The operating method according to claim 9, wherein the memory cell array is a triple level cell (TLC), and the plurality of subpage data includes a least significant bit (LSB) page data, a center significant bit (CSB) page data and a most significant bit (MSB) page data, wherein the sequentially storing the respective buffered N subpage data of the first page data in the memory cell array comprises storing the LSB page data in the memory cell array, and storing the CSB page data in the memory cell array when the storing for the LSB page data is completed, and storing the MSB page data in the memory cell array when the storing for the CSB page data is completed.

15. The operating method according to claim 14, wherein the receiving and caching the $M^{th}$ subpage data of the second page data comprises receiving and caching the LSB page data of the second page data from the controller, when storing the LSB page data of the first page data in the memory cell array is completed.

16. The operating method according to claim 14, wherein the receiving and caching the $M^{th}$ subpage data of the second page data comprises receiving and caching the CSB page data of the second page data from the controller, when storing the CSB page data of the first page data in the memory cell array is completed.

* * * * *